US012810191B2

(12) United States Patent
Khaira et al.

(10) Patent No.: US 12,810,191 B2
(45) Date of Patent: *Nov. 24, 2026

(54) MAGNET-LESS CIRCULATOR FOR HYBRID-CLASSICAL QUBIT READ-OUT SYSTEMS WITH BUILT-IN PHASE MODULATION

(71) Applicant: Dell Products L.P., Round Rock, TX (US)

(72) Inventors: Navjot Kaur Khaira, Manotick (CA); Tejinder Singh, Manotick (CA)

(73) Assignee: DELL PRODUCTS L.P., Round Rock, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/919,198

(22) Filed: Oct. 17, 2024

(65) Prior Publication Data

US 2026/0111779 A1 Apr. 23, 2026

(51) Int. Cl.
*G06N 10/40* (2022.01)
*H01P 1/383* (2006.01)
(Continued)

(52) U.S. Cl.
CPC ............. *G06N 10/40* (2022.01); *H01P 1/383* (2013.01); *H03K 17/92* (2013.01); *H10N 69/00* (2023.02)

(58) Field of Classification Search
CPC ........ G06N 10/40; H10N 69/00; H01P 1/383; H03K 17/92
See application file for complete search history.

(56) References Cited

U.S. PATENT DOCUMENTS 9,405,136 B2 * 8/2016 Alu ........................ G02B 26/08
11,677,129 B2 6/2023 Stace et al.
(Continued)

FOREIGN PATENT DOCUMENTS

WO 2021/140995 A1 7/2021

OTHER PUBLICATIONS

R. Fleury et al., "Sound isolation and giant linear nonreciprocity in a compact acoustic circulator," Science, vol. 343, No. 6170, pp. 516-519, 2014.
(Continued)

*Primary Examiner* — Daniel C Puentes
(74) *Attorney, Agent, or Firm* — Amin, Turocy & Watson, LLP

(57) ABSTRACT

The technology described herein is directed towards a cryogenic magnet-less circulator device, in which the circulator device is based on the spatiotemporal modulation of angular momentum for microwave photons, controlled using a modulated control signal. The circulator device is configured for integration with a quantum computer, e.g., to facilitate qubit measurements. The circulator topology and design are based on tank circuits, e.g., arranged in a star topology with different sets of radio frequency superconducting quantum interference devices (rf-SQUIDS) per tank circuit, that resonate out-of-phase based on the modulated control signal. A single control line can be used to operate the circulator. The circulator can be fabricated using standard semiconductor processes, allowing one or more circulators to be integrated on the same superconducting chip as the qubits. A classical computer can be used to output the modulated control signal, and adapt the modulated control signal as needed under varying conditions.

20 Claims, 12 Drawing Sheets

(51) Int. Cl.
*H03K 17/92* (2006.01)
*H10N 69/00* (2023.01)

(56) References Cited

U.S. PATENT DOCUMENTS

| | | | | |
|---|---|---|---|---|
| 12,451,575 | B2 * | 10/2025 | Khaira | G06N 10/40 |
| 2017/0091648 | A1 | 3/2017 | Abdo | |
| 2018/0040935 | A1 | 2/2018 | Sliwa et al. | |
| 2019/0372192 | A1 | 12/2019 | Mueller | |
| 2023/0155593 | A1 | 5/2023 | Abdo et al. | |
| 2024/0372627 | A1 | 11/2024 | Abdo | |

OTHER PUBLICATIONS

J. C. Bardin et al. "Microwaves in Quantum Computing" in IEEE Journal of Microwaves, Jan. 2021.

S. Krinner et al. "Engineering cryogenic setups for 100-qubit scale superconducting circuit systems" in EPJ Quantum Technology, vol. 6, No. 1, 2019.

"High Power Circulator With 20 dB Isolation From 7 GHz to 12.4 GHZ, 50 Watts And SMA Female—Product ID: PE83CR1008" Pasternack. [https://www.pasternack.com/high-power-circulator-20db-isolation-12.4-ghz-50-watts-sma-female-pe83cr1008-p.aspx] retrieved Dec. 8, 2025, 4 pages.

"Multiresonator quantum memory-interface"—Scientific Figure on ResearchGate. Available from: [https://www.researchgate.net/figure/a-Simulation-of-the-microwave-field-in-the-QMI-system-using-the-CST-Studio-Suite-2015_fig3_319209666], retrieved Dec. 8, 2025, 13 pages.

Moiseev et al. "Broadband multiresonator quantum memory-interface" Scientific Reports, Mar. 2018, 9 pages.

Singh et al. "Superconducting Magnet-Less Circulator for Monolithically Integrated Quantum Memory Devices" U.S. Appl. No. 18/967,611, filed Dec. 3, 2024, 43 pages.

Singh et al. "Multi-Resonator Random Access Quantum Memory With Integrated Magnet-Less Circulator" U.S. Appl. No. 18/967,616, filed Dec. 3, 2024, 41 pages.

Non-Final Office Action received for U.S. Appl. No. 18/967,611 dated Jul. 13, 2026, 29 pages.

Notice of Allowance received for U.S. Appl. No. 18/967,616 dated Jun. 1, 2026, 10 pages.

* cited by examiner

MAGNET-LESS CIRCULATOR FOR HYBRID-CLASSICAL QUBIT READ-OUT SYSTEMS WITH BUILT-IN PHASE MODULATION

BACKGROUND

A circulator device (or simply "circulator") is a nonreciprocal three-port device that controls the direction of signal flow. Unlike reciprocal devices where signals can flow in both directions equally, a circulator allows signals to travel in only one predetermined direction among its three ports.

Cryogenic circulators are used for the accurate readout of quantum bits (qubits). Circulators operate by isolating successive components in the readout line and preventing back-reflected signals from interfering with sensitive components such as the qubit or readout amplifiers. Traditional circulators, which rely on magnetic biasing of ferrite materials, are challenging to integrate with other superconducting components, in part due to their bulky nature and the need for large, incompatible magnetic bias fields.

BRIEF DESCRIPTION OF THE DRAWINGS

The technology described herein is illustrated by way of example and not limited to the accompanying figures in which like reference numerals indicate similar elements and in which.

DETAILED DESCRIPTION

Figure 1:
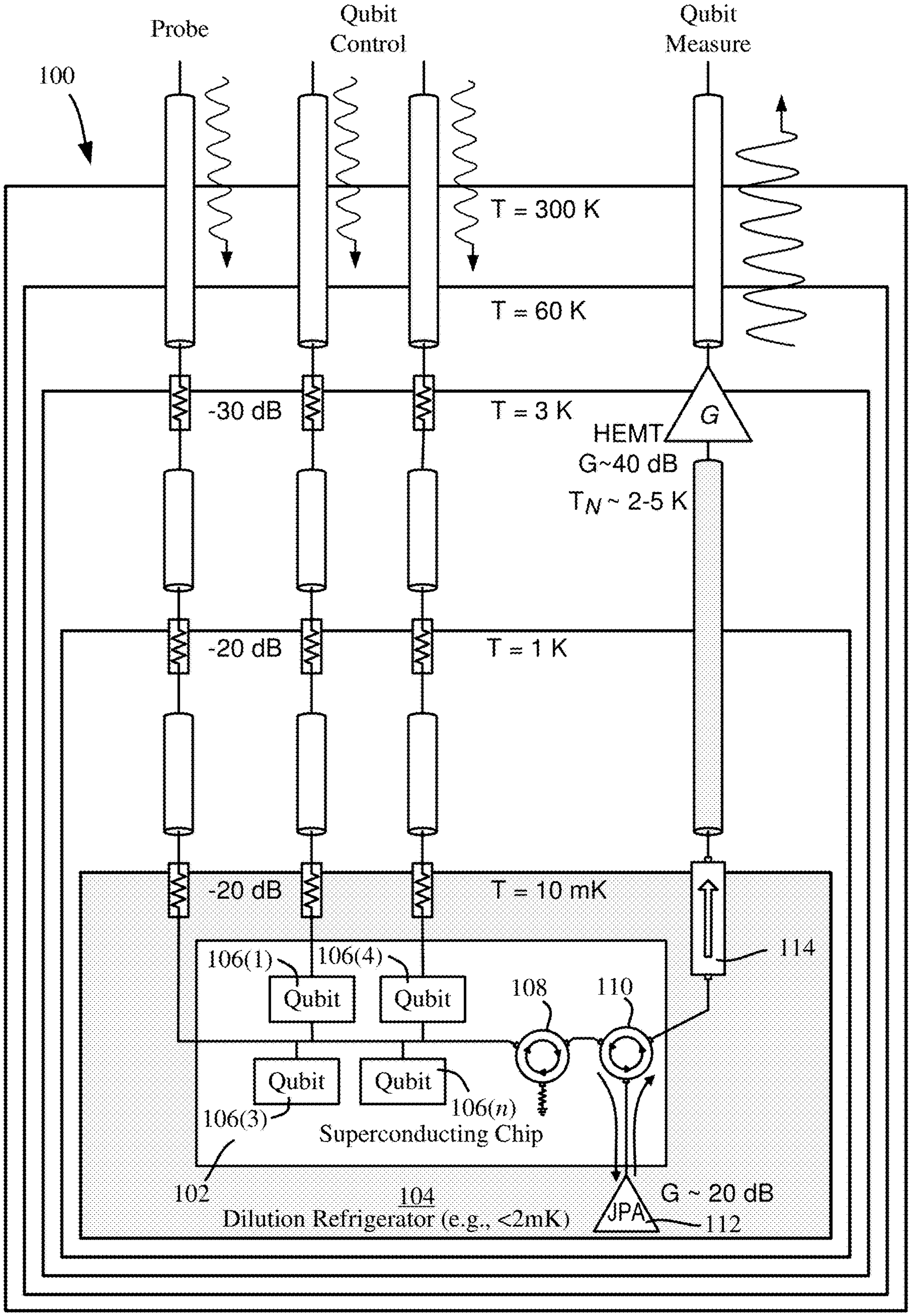
FIG. 1 is a conceptual representation of a quantum computer including a dilution refrigerator with qubits and two coupled magnet-less circulators (one configured for clockwise signal routing and one configured for counter-clockwise signal routing), in accordance with various example embodiments and implementations of the subject disclosure.

The technology described herein is generally directed to a cryogenic circulator topology and design based on using spatiotemporal modulation of angular momentum for microwave photons to facilitate coupling of an input signal obtained at a first circulator port of a circulator device (or simply "circulator") to a second circulator port, while impeding the flow of the signal to a third circulator port. As will be understood, the circulator topology and design described herein achieves nonreciprocity while eliminating the need for circulators to rely on magnetic bias fields, resulting in reduced physical circulator size, and facilitating seamless integration with superconducting qubits. Indeed, the circulators described herein are relatively compact, low-loss, and magnet-free for integration with qubits, including on a single superconducting chip.

In one implementation, the control signal for operation of the circulator can be provided by a classical computer, e.g., through a peripheral component interconnect express (PCIe)-based interface. There can be a single control line that provide the circulator modulation, (instead of three separate lines), which allows precise control and synchronization of the modulation signals, while accommodating a larger number of qubits in the same dilution refrigerator due to the reduced number of control wires needed per circulator. The integration facilitates seamless, real-time control of the circulator parameters, enhancing the flexibility and efficiency of quantum readout operations. By leveraging PCIe-based control, quantum systems can achieve seamless integration and compatibility with existing classical computing infrastructure, facilitating hybrid quantum-classical systems. This integration simplifies the process and reduces costs, as it aligns with widely-used classical hardware.

Reference throughout this specification to "one embodiment," "an embodiment," "one implementation," "an implementation," etc. means that a particular feature, structure, characteristic and/or attribute described in connection with the embodiment/implementation can be included in at least one embodiment/implementation. Thus, the appearances of such a phrase "in one embodiment," "in an implementation," etc. in various places throughout this specification are not necessarily all referring to the same embodiment/implementation. Furthermore, the particular features, structures, characteristics and/or attributes may be combined in any suitable manner in one or more embodiments/implementations. Repetitive description of like elements employed in respective embodiments may be omitted for sake of brevity.

The detailed description is merely illustrative and is not intended to limit embodiments and/or application or uses of embodiments. Furthermore, there is no intention to be bound by any expressed or implied information presented in the preceding sections, or in the Detailed Description section. Further, it is to be understood that the present disclosure will be described in terms of a given illustrative architecture; however, other architectures, structures, materials and process features, and steps can be varied within the scope of the present disclosure.

It also should be noted that terms used herein, such as "optimize," "optimization," "optimal," "optimally" and the like only represent objectives to move towards a more optimal state, rather than necessarily obtaining ideal results. Similarly, "maximize" means moving towards a maximal state (e.g., up to some processing capacity limit), not necessarily achieving such a state, and so on.

It will also be understood that when an element such as a layer, region or substrate is referred to as being "on" or "over" "atop" "above" "beneath" "below" and so forth with respect to another element, it can be directly on the other element or intervening elements can also be present. In contrast, only if and when an element is referred to as being "directly on" or "directly over" another element, are there no intervening element(s) present. Note that orientation is generally relative; e.g., "on" or "over" can be flipped, and if so, can be considered unchanged, even if technically appearing to be under or below/beneath when represented in a flipped orientation. It will also be understood that when an element is referred to as being "connected" or "coupled" to another element, it can be directly connected or coupled to the other element or intervening elements can be present. In contrast, only if and when an element is referred to as being "directly connected" or "directly coupled" to another element, are there no intervening element(s) present.

The following detailed description is merely illustrative and is not intended to limit embodiments and/or application or uses of embodiments. Furthermore, there is no intention to be bound by any expressed or implied information presented in the preceding sections, or in the Detailed Description section.

One or more example embodiments are now described with reference to the drawings, in which example components, graphs and/or operations are shown, and in which like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details, and that the subject disclosure may be embodied in many different forms and should not be construed as limited to the examples set forth herein.

FIG. 1 is a block diagram representation of an example quantum processor measurement and control setup/system 100 including a typical measurement and control setup for a superconducting quantum computing chip 102 near the base plate of a dilution refrigerator 104 on the order of 10 milli-Kelvin (mK). Some number of qubits 106(1)-106(*n*) (four are depicted, but any practical number may be present) are fabricated on the superconducting quantum computing chip 102. Significantly, unlike magnet-based circulators, described herein are magnet-less circulators 108 and 110 that can be fabricated on the superconducting quantum computing chip 102.

Also shown in FIG. 1 as part of the qubit measuring portion is a Josephson parametric amplifier (JPA) 112, an isolator 114 and a high electron mobility transistor (HEMT) G. In general, a probe signal that is a set of strongly attenuated microwave tones (<−120 dBm) is by injected via coaxial cables (depicted as unshaded cylinders) and attenuators to the qubits 106(1)-106(*n*) through the various levels of the quantum processor 100, resulting in a measurement signal being input via a readout line to a first port of the magnet-less circulator 108. As described herein, the magnet-less circulator 108 is configured for clockwise rotation, whereby the signal is routed to a second port (low insertion loss) and not the third port (high isolation, and coupled via resistor to ground), nor returned to the first port (low return loss). The second port is coupled to the input port of a second magnet-less circulator 110 configured for counter-clockwise rotation, such that the signal is routed to at least one Josephson parametric amplifier (JPA) 112, with the amplified measurement signal routed back to the output port of the second magnet-less circulator 110 though the isolator 114 to the HEMT G for further gain before measurement by one or more conventional RF devices (not explicitly shown). Note that the shaded cylinder shown in the measurement signal output path represents a superconducting coaxial cable. Based on the measurement results, qubit control signals can be sent to the qubits 106(1)-106(*n*).

Thus, each magnet-less circulator is a nonreciprocal three-port device that allows signals to travel in only one predetermined direction among its three ports, whereby the qubit readout line uses such circulators 108 or 110 to provide isolation between different components so as to maintain the fidelity of the qubit readout. By isolating different parts of the readout circuit, circulators help in reducing noise that could otherwise affect the qubit's state and/or the accuracy of the readout. Multiple circulators are used in the quantum computing setup, ensuring that signals are correctly channeled to the appropriate destinations as shown in FIG. 1.

To summarize, the state of the superconducting qubits is probed, and the readout involves amplifying and delivering the measured result back to room temperature. The weak output signal from a qubit is amplified using one or more superconducting parametric amplifiers, such as Josephson parametric amplifiers (JPA), operating at 10 mK and semiconductor high electron mobility transistor (HEMT) amplifiers operating at 4 K. The RF circulators are used to protect the quantum circuit from reflections and noise; the probing, control, and readout of qubit systems involves a large amount of microwave hardware.

Magnet-less circulators are described herein, in contrast to the large, low-bandwidth magnet-based circulators used in existing quantum measurement setups, which use bulky magnetic materials and external magnetic fields. Note that traditional magnet-based circulators can be highly impractical for integration, as the magnetic fields from traditional circulators can interfere with the qubits themselves, which are highly-sensitive to external magnetic fields; magnetic materials also can behave unpredictably at these extremely low temperatures, affecting performance. The magnet-less circulators described herein are far more compact and integrable, supporting the scaling up of quantum computers.

The magnet-less circulators described herein are based on the spatiotemporal modulation technique, somewhat akin to a compact acoustic circulator used to achieve sound isolation and nonreciprocity via mechanical rotation. Instead of mechanical rotation, electronic spatiotemporal modulation is used for microwave photons in the quantum computing circulators.

Figure 2:
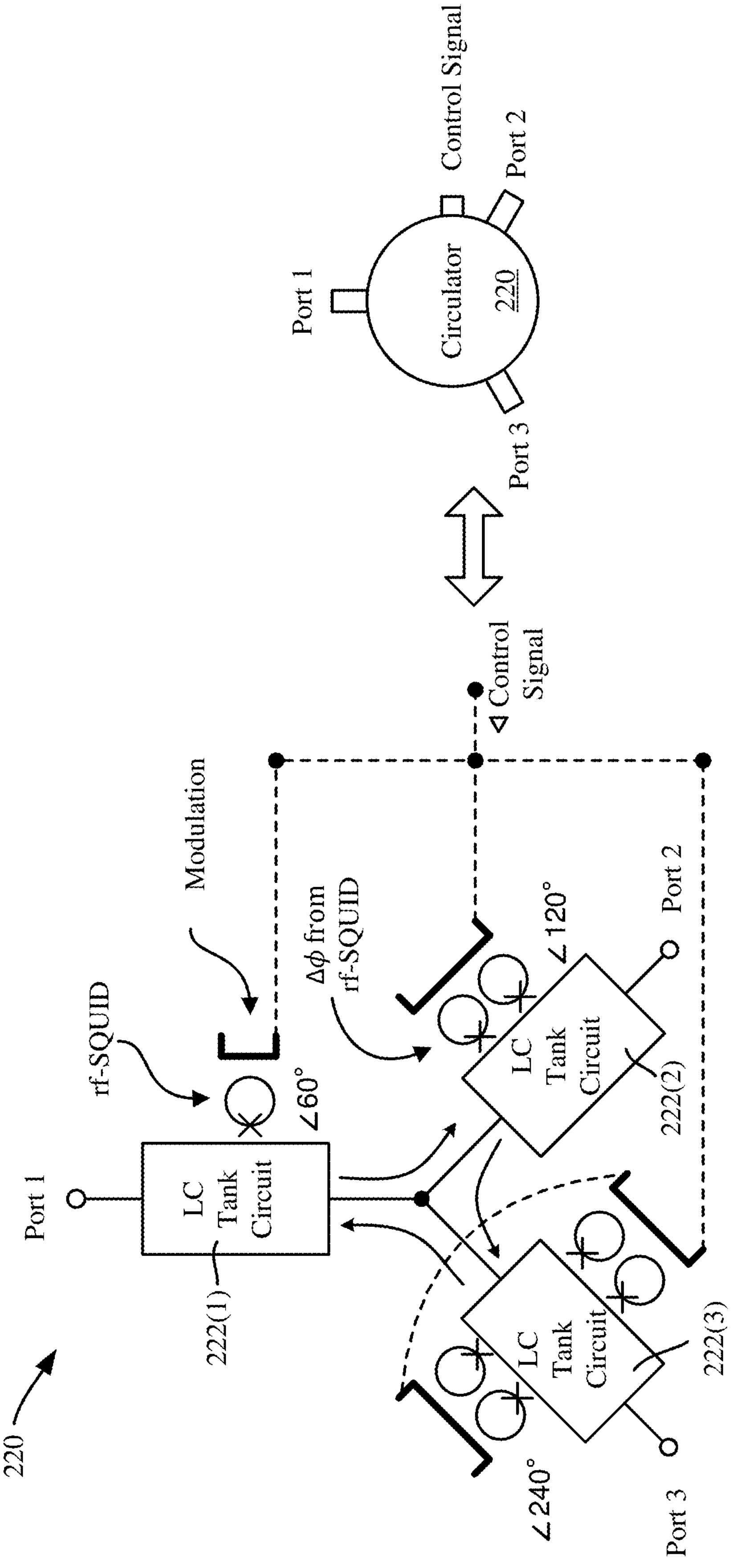
FIG. 2 is an example simulation model for a magnet-less circulator including three inductor-capacitor (LC) tank circuits with a microwave modulation signal provided to each (left portion), corresponding to a circulator with three input/output ports and a control signal right (right portion), in accordance with various example embodiments and implementations of the subject disclosure.

FIG. 2 shows one example magnet-less circulator design 220 that includes three inductor-capacitor (LC) tank circuits 222(1)-222(3) interconnected in a star topology. Each of the LC tank circuits 222(1)-222(3) is basically a resonator that is modulated to create an effective angular momentum bias, facilitating nonreciprocal transmission. The modulation frequencies and amplitudes can be optimized to achieve desired isolation and insertion loss characteristics, making such a circulator compact, magnet-free, and suitable for integration with superconducting qubits.

For electromagnetic waves, generating angular momentum to achieve nonreciprocity can be accomplished through spatiotemporal modulation using a travelling wave. In one implementation, the circulator device 220 includes three identical LC tank circuits 222(1)-222(3), strongly and symmetrically interconnected in a star topology as shown in FIG. 2, each with a fixed-value capacitor and inductor.

The tank circuit inductors are strongly coupled to rf-SQUIDs (radio frequency superconducting quantum interference devices), making them flux tunable. Each rf-SQUID has one Josephson junction shunted by an inductive superconductive loop; in FIG. 2, each rf-SQUID is represented as a generally circulator loop with a crossed "x" portion representing a Josephson junction. A Josephson junction is a fundamental component in superconducting quantum circuits, made from two superconductors separated by a thin insulating barrier. When a current flows through the junction, the current can tunnel through the insulator without any voltage drop, a phenomenon known as the Josephson effect. A rf-SQUID combines the physical phenomenon of flux quantization and Josephson tunneling. Each rf-SQUID is further coupled to a control line providing a phase change of 60° to each SQUID. The control line is provided with a modulation signal of an appropriate amplitude and frequency.

The circuit represented in FIG. 2 does not allow transmission to any port without modulation; however, when angular momentum is imparted, the degenerate modes of the loop split, facilitating nonreciprocal transmission. To achieve the circulator operation, the resonant frequencies of three LC tank circuits 222(1)-222(3) are modulated by the control signal with identical amplitude and a relative phase difference of 120° between the consecutive ones as shown in FIG. 2, effectively imparting electronic angular momentum to the system. Three oscillatory microwave tones are used to modulate the inductance and, therefore, the frequency of three resonant circuits in a cyclic manner. By selecting the appropriate modulation amplitude and frequency, the two modes interfere destructively at one port (port 3) and constructively at the other port (port 2), thus fulfilling the operation of a circulator. Note that this is based on having one rf-SQUID used with the first LC tank circuit 222(1), two rf-SQUIDs used with the second LC tank circuit 222(2) to provide 120° phase difference between the first and second tank circuits, and four rf-SQUIDs used with the third LC tank circuit 222(3) to provide another 120° phase difference between the second and third tank circuits (and hence a 240° phase difference between the first and third tank circuits).

Mathematically, the circuit can be represented as three resonators with resonance frequencies of $\omega_1$, $\omega_2$, and $\omega_3$ coupled to each other with a coupling coefficient k. Without modulation, the three LC tanks resonate at the same frequency of:

$$\omega_1 = \omega_2 = \omega_3 = \omega_0 = 1\Big/\sqrt{L_0 C}.$$

With temporal modulation $$\omega_1(t) = \omega_0 + a_m\cos(\omega_m t)$$
$$\omega_2(t) = \omega_0 + a_m\cos(\omega_m t + 2\pi/3)$$
$$\omega_3(t) = \omega_0 + a_m\cos(\omega_m t + 4\pi/3).$$

where $\omega_0$ is the static value of the resonant frequency, $a_m$ is the modulation amplitude and $\omega_m$ is the modulation frequency. The current flowing through the three resonators can be interpreted as a superposition of two counter-rotating modes. Without modulation, these two counter-rotating modes are degenerate; consequently, if a signal is applied from one port, transmission to the other ports is equal and the network is reciprocal. When modulation is applied, the modulation synthesizes an effective angular-momentum bias in the clockwise direction because the phases of the modulation signals increase by 120° in that direction, thus lifting the degeneracy of the rotating modes and enabling them to oscillate at different frequencies, achieving a nonreciprocal routing of the signals between the ports.

Figure 3:
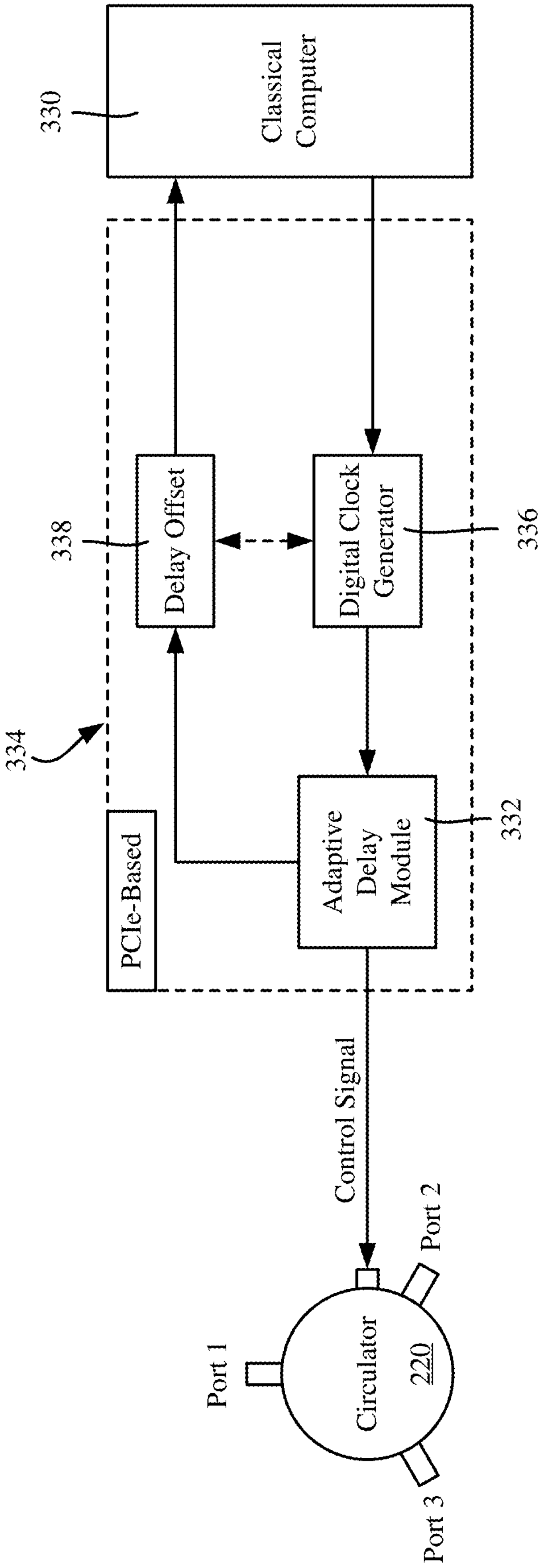
FIG. 3 is a representation of single-wire control signal manipulation for an example magnet-less circulator, in which the control signal is PCIe-based, in accordance with various example embodiments and implementations of the subject disclosure.

In one implementation, with this topology the control signal for operation of the circulator 222 can be provided from a classical computer 330, e.g., with a PCIe-based adaptive delay module 332 as shown in FIG. 3. In the PCIe interface 334, a digital clock generator 336 and a delay offset 338 are also included. Note that in varying conditions, the modulation frequency and amplitude can be tuned by the classical computer 330 to provide robust operation according to any new conditions. Leveraging interfaces such as PCIe allows quantum systems to seamlessly integrate and remain compatible with existing classical computing infrastructure, facilitating the creation of hybrid quantum-classical systems. This alignment with widely-used classical hardware simplifies the integration process and reduces costs.

It should be noted that it is feasible to have more than one modulated control signal and one more than one control line. For example, there can be three control lines with three modulated control signals each 120° out of phase based on delay from the classical computer/clock generator. If so, the adaptive delay module may not be needed. However, the use of a shared control line for one or more circulators provides substantial benefits relative to multiple control lines, including reduced overall size (corresponding to accommodating more qubits in the same dilution refrigerator), reduced cable cost and labor (one shared wire versus three separate wires), and the like.

Figure 4:
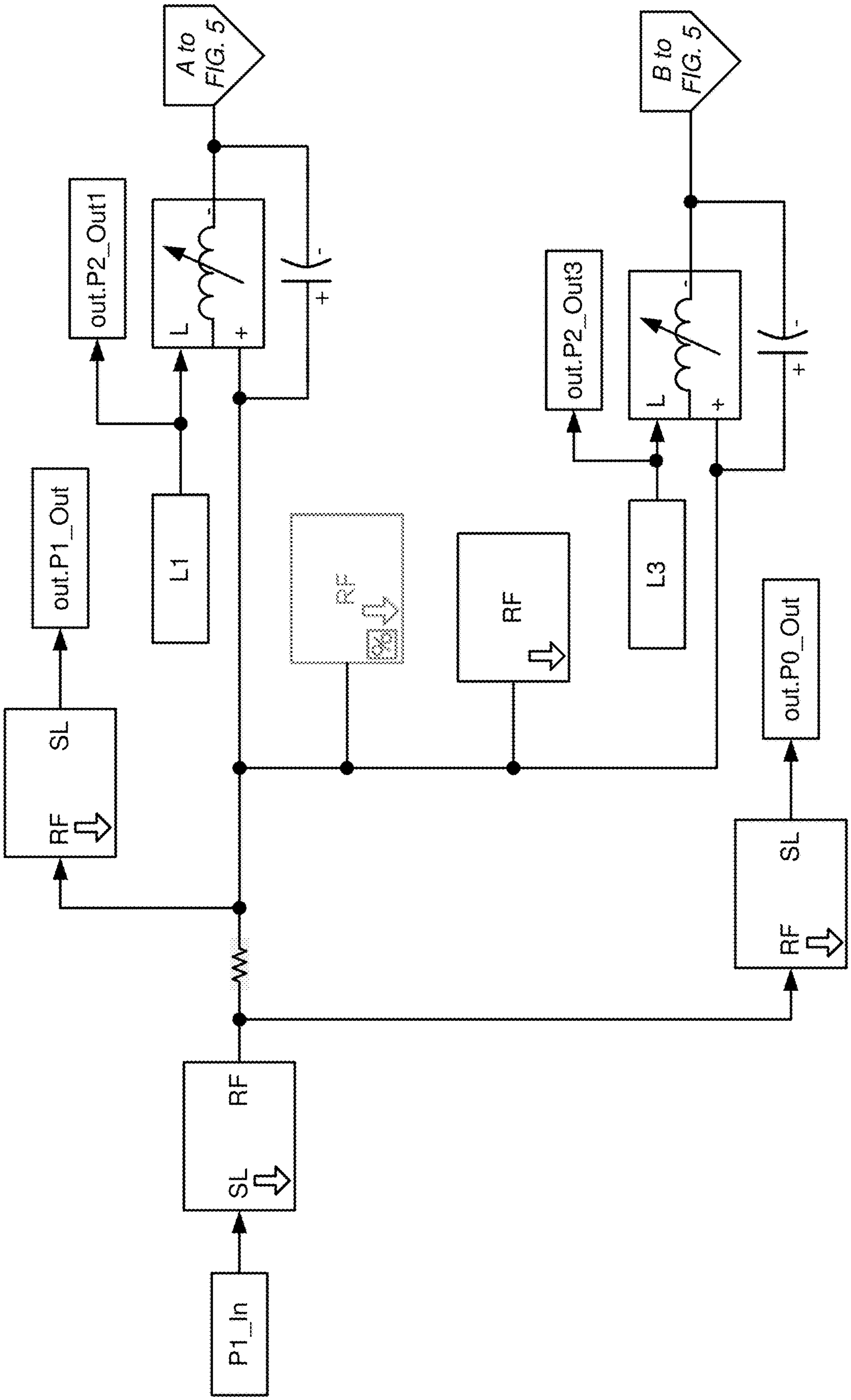
FIGS. 4 and 5 comprise an example simulation model for a magnet-less circulator, in accordance with various example embodiments and implementations of the subject disclosure.
Figure 5:
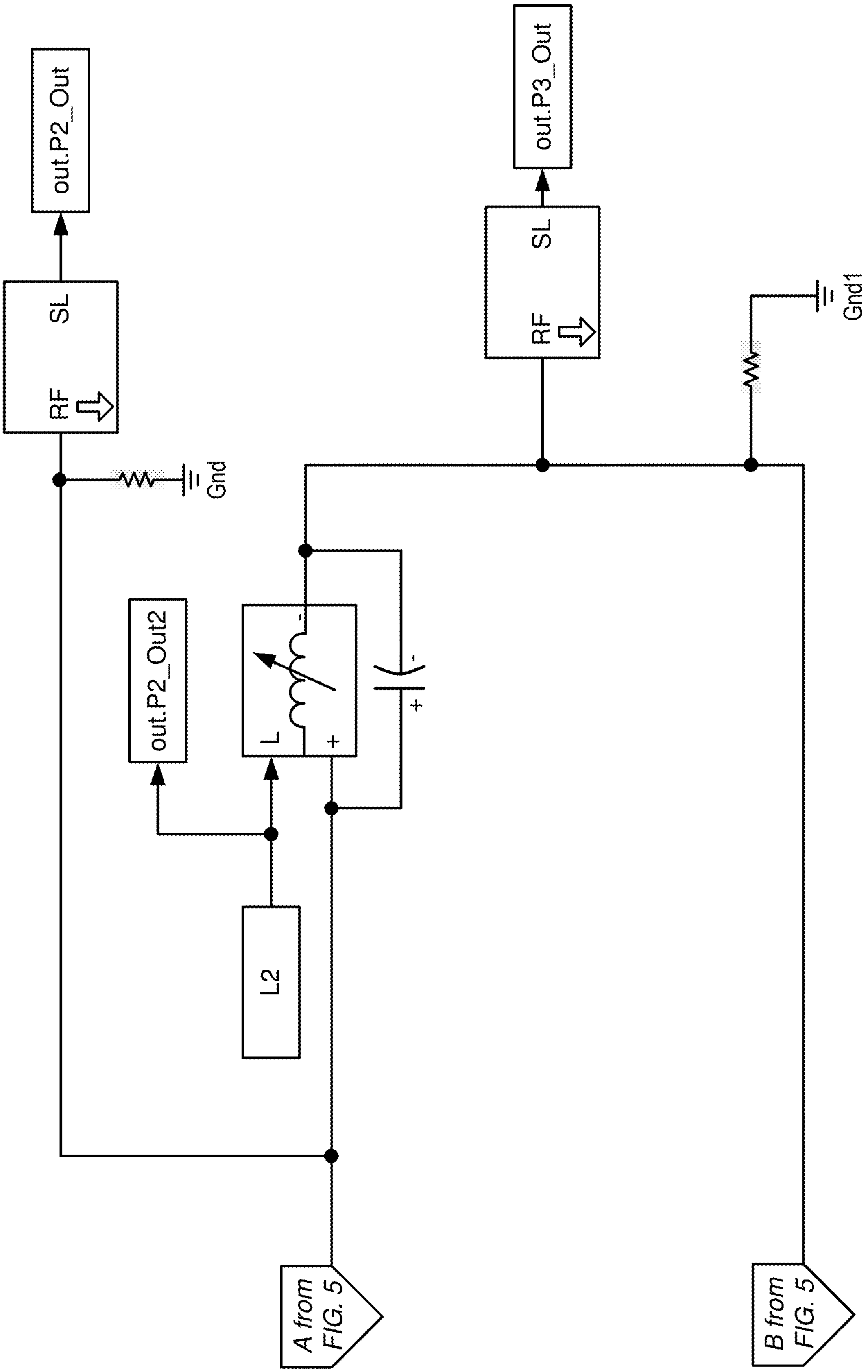
Figure 6:
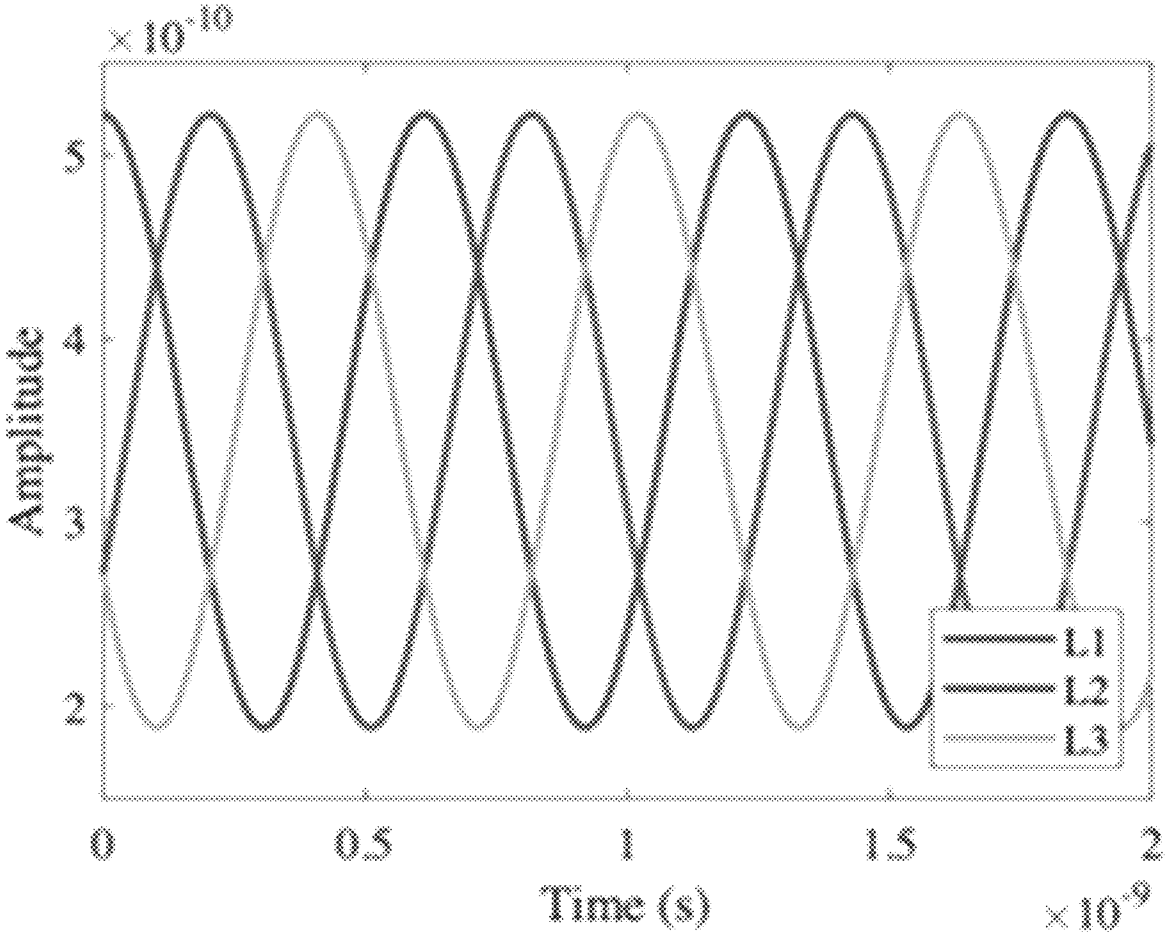
FIG. 6 is a representation of three 120° out-of-phase microwave modulation control signals corresponding to a magnet-less circulator, in accordance with various example embodiments and implementations of the subject disclosure.

To validate the technology described herein, the circuit depicted in FIGS. 4 and 5 shows a simulated model for the circulator, (e.g., based on MATLAB and SIMULINK), for the three LC tank circuits connected in a Star topology. FIG. 6 highlights the 120° out of phase microwave modulation control signals. The modulation signal is applied in a clockwise manner, with a 120° phase increment between the successive ports.

Ideally, the signal applied at port 1 should be routed entirely to port 2 (with minimal insertion loss), with no signal at port 3 (maximum isolation). In order to find the values of frequency and amplitude of the modulation signal that lead to the desired circulation operation, the input signal transmission to the three ports is noted for a sweep of frequency values and amplitude.

Figure 7A:
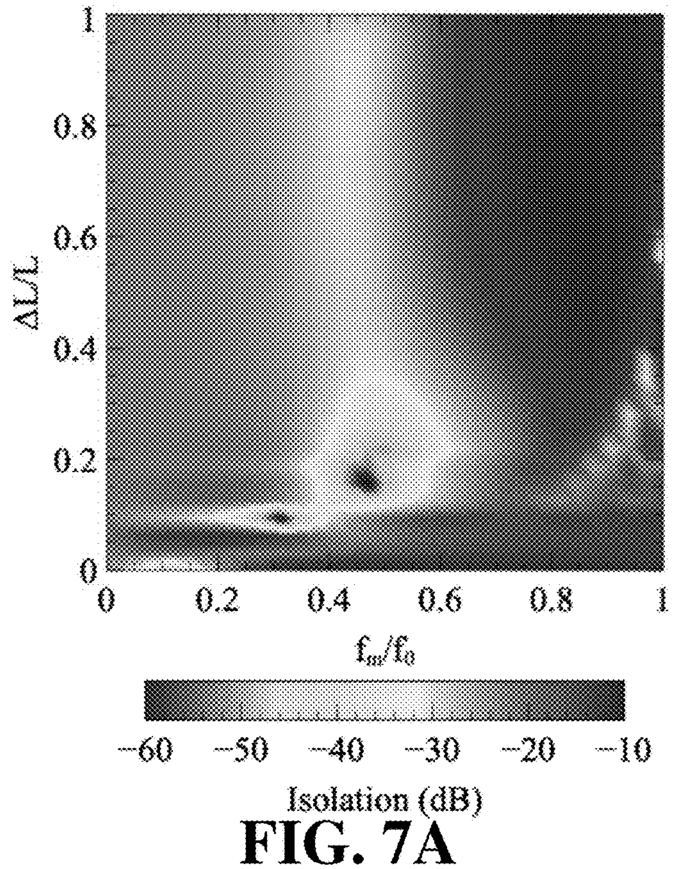
FIG. 7A is an example simulated surface plot of S-parameters versus the normalized modulation frequency and normalized modulation amplitude with respect to isolation of the magnet-less circulator, in accordance with various example embodiments and implementations of the subject disclosure.
Figure 7B:
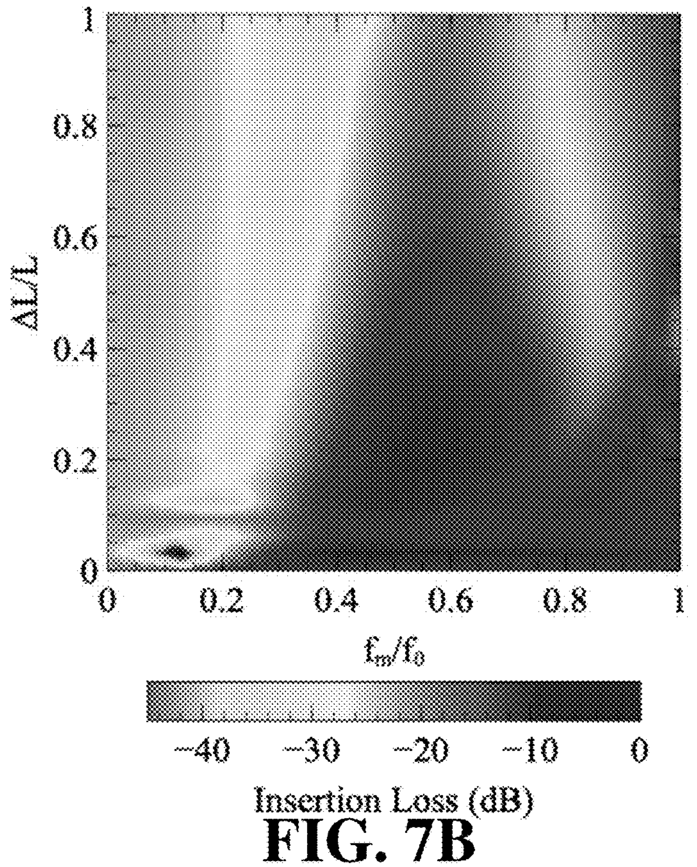
FIG. 7B is an example simulated surface plot of S-parameters versus the normalized modulation frequency and normalized modulation amplitude with respect to insertion loss of the magnet-less circulator, in accordance with various example embodiments and implementations of the subject disclosure.
Figure 8:
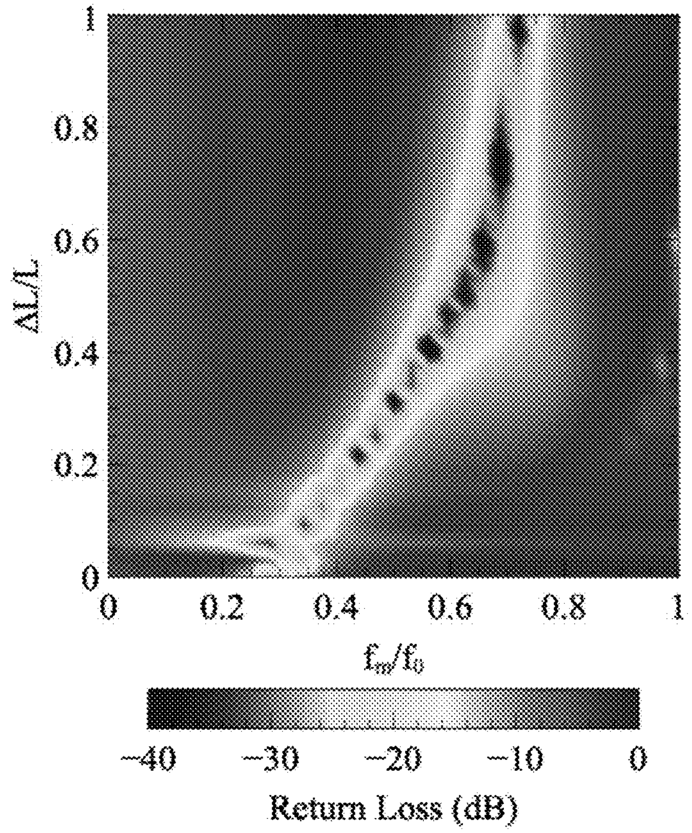
FIG. 8 is an example simulated surface plot of S-parameters versus the normalized modulation frequency and normalized modulation amplitude with respect to return loss of the magnet-less circulator, in accordance with various example embodiments and implementations of the subject disclosure.

FIGS. 7A and 7B show the S-parameters versus the normalized modulation frequency $f_m/f_0$ and normalized modulation amplitude $\Delta L/L_0$ for $f_0=10$ GHz, C=0.76 pF, $L_0=0.37$ nH. For a signal applied at port 1, FIG. 7A shows the surface plot of transmitted signal (in dB) to port 3 (isolation), while FIG. 7B shows the signal (in dB) received at port 2 (insertion loss). FIG. 8 shows the reflected signal (in dB) back to port 1 (return loss).

Figure 9A:
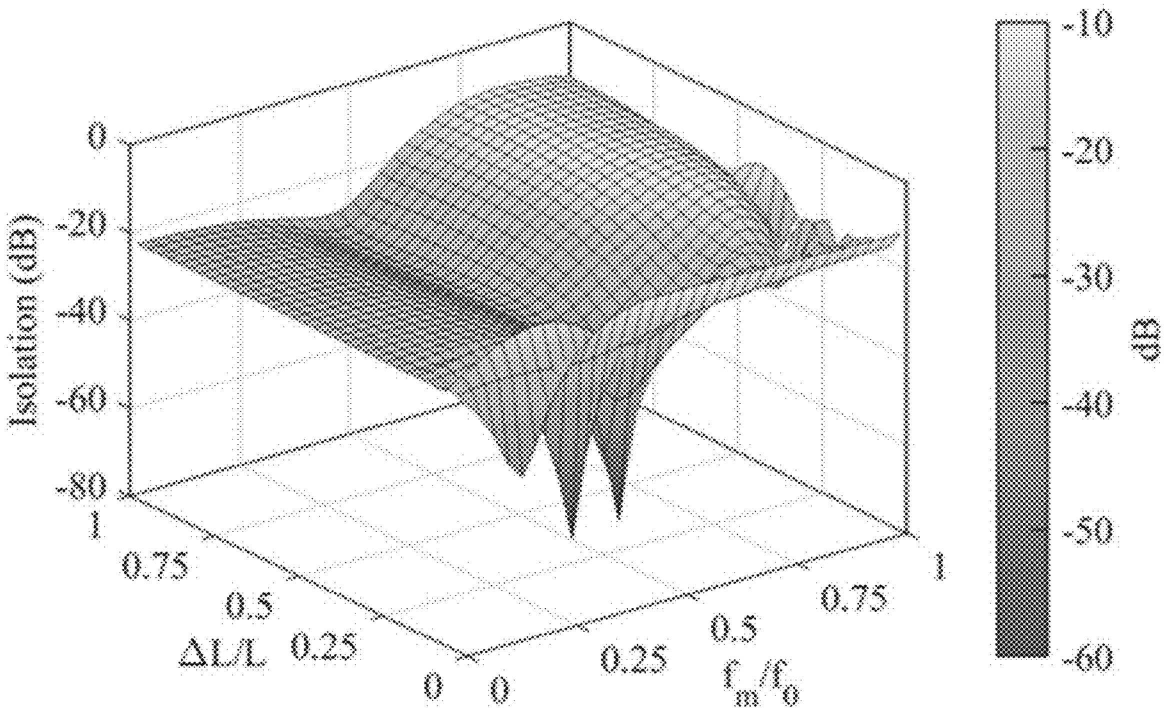
FIG. 9A is an example simulated three-dimensional plot of S-parameters versus the normalized modulation frequency and normalized modulation amplitude with respect to isolation of the magnet-less circulator, in accordance with various example embodiments and implementations of the subject disclosure.
Figure 9B:
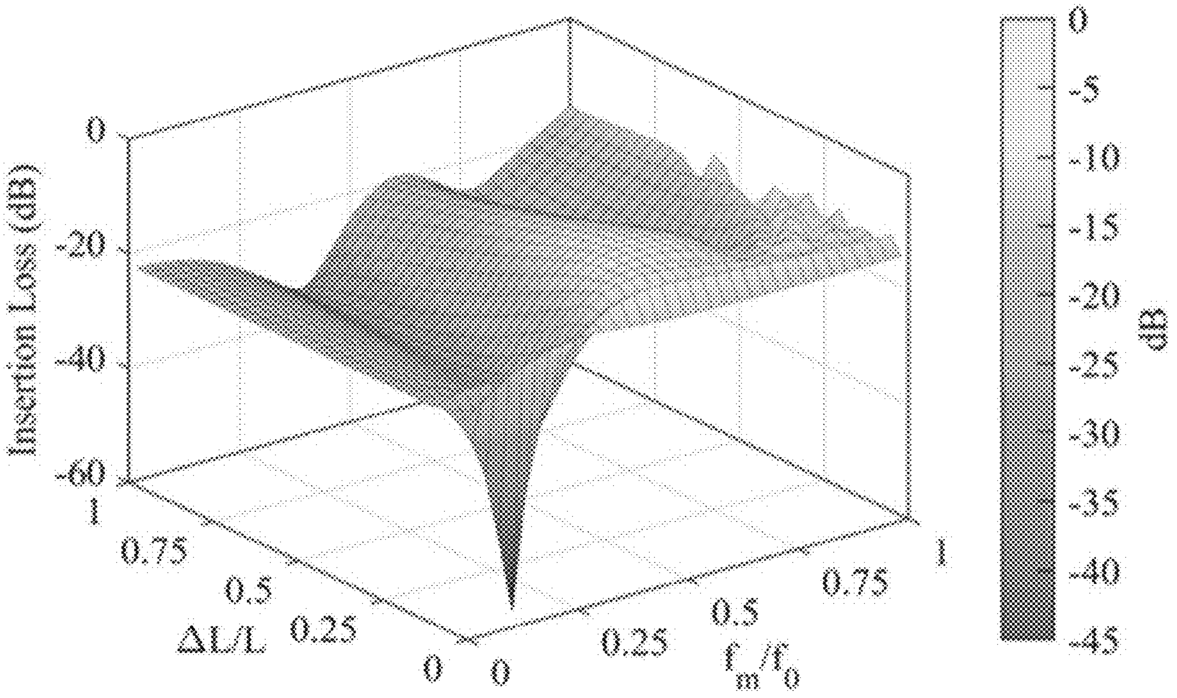
FIG. 9B is an example simulated three-dimensional plot of S-parameters versus the normalized modulation frequency and normalized modulation amplitude with respect to insertion loss of the magnet-less circulator, in accordance with various example embodiments and implementations of the subject disclosure.
Figure 10A:
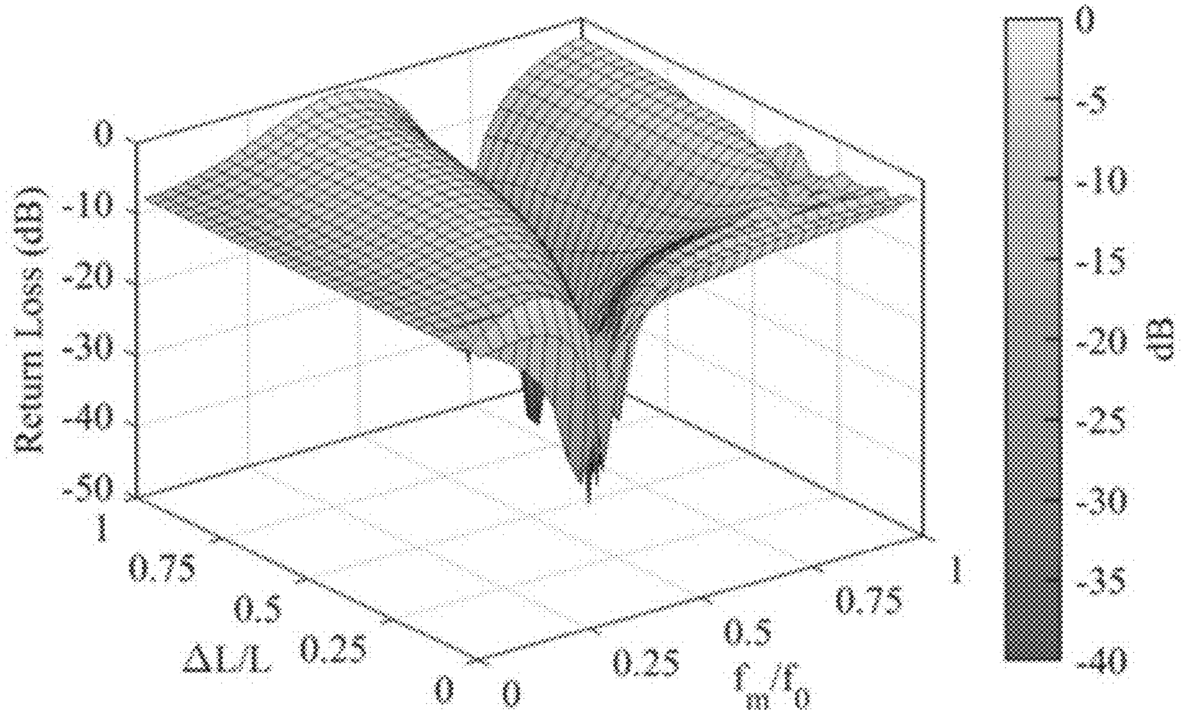
FIG. 10A is an example simulated three-dimensional plot of S-parameters versus the normalized modulation frequency and normalized modulation amplitude with respect to return loss of the magnet-less circulator, in accordance with various example embodiments and implementations of the subject disclosure.

FIGS. 9A, 9B and 10A shows the 3D plots of isolation ($S_{31}$), insertion loss ($S_{21}$) and return loss ($S_{11}$). The simulation results in FIGS. 7A, 7B and 8, along with FIGS. 9A, 9B and 10A help in finding the modulation parameters for which the S-parameters become optimum, ideally, with minimum return loss, minimum insertion loss, and maximum isolation. These quantities do not necessarily become optimum under the same modulation parameters, and therefore it may be necessary to trade off one of them when selecting the best possible modulation parameters. In this case, the selected modulation frequency is 1.63 GHZ and the amplitude is 0.47 times the inductance $L_0$.

Figure 10B:
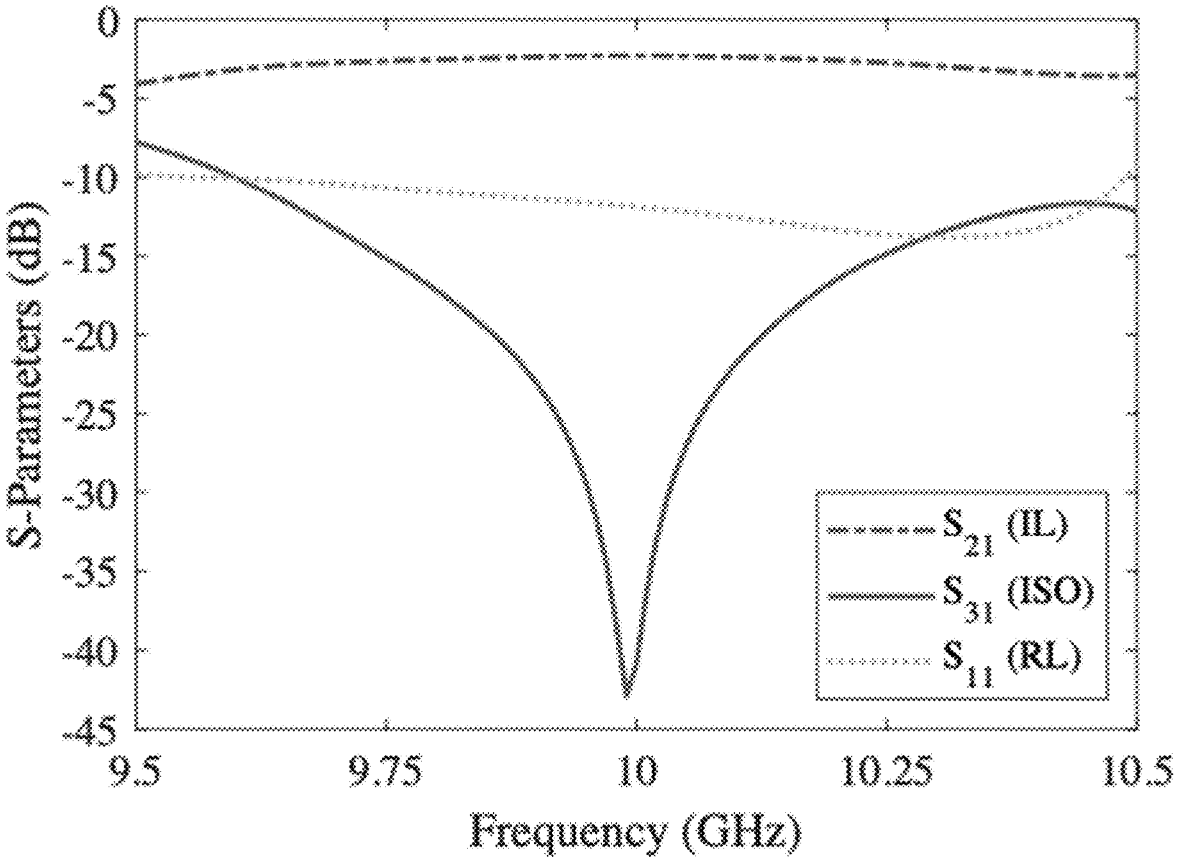
FIG. 10B is an example graphical representation of simulated S-parameters showing non-reciprocal operation of a magnet-less circulator, in accordance with various example embodiments and implementations of the subject disclosure.

In simulations, a center frequency of circulator at 10 GHz was assumed. At a modulation frequency of 1.63 GHZ, the device exhibits significant isolation, insertion loss, and return loss, of 43 dB, 2 dB, and 12 dB, respectively, at 10 GHz as shown in FIG. 10B.

One or more implementations and embodiments can be embodied in a system, such as described and represented in the example herein. The system can include a magnet-less circulator device, which can include a first circulator port coupled to a first resonator, the first resonator inductively resonating at a first resonant frequency, based on a first modulated microwave frequency control signal having a first phase. The system can include a second circulator port coupled to a second resonator, the second resonator inductively resonating at a second resonant frequency, based on a second modulated microwave frequency control signal having a second phase that can be phase-shifted relative to the first phase, and a third circulator port coupled to a third resonator, the third resonator inductively resonating at a third resonant frequency, based on a third modulated microwave frequency control signal having a third phase that can be phase-shifted relative to the first phase and phase-shifted relative to the second phase. For an input signal obtained at the first port, the first resonant frequency and the second resonant frequency interfere constructively to facilitate a flow of the first input signal to the second port, and the first resonant frequency and the third resonant frequency interfere destructively to impede the flow of the first input signal to the third port.

The second phase can be one-hundred-and-twenty degrees phase-shifted relative to the first phase, and the second phase can be two-hundred-and-forty degrees phase-shifted relative to the first phase.

The first resonator can include a first tank circuit inductively coupled to the first modulated microwave frequency control signal, the second resonator can include a second tank circuit inductively coupled to the second modulated microwave frequency control signal, and the third resonator can include a third tank circuit inductively coupled to the third modulated microwave frequency control signal.

The first tank circuit can be inductively coupled to the first modulated microwave frequency control signal by a first radio frequency-superconducting quantum interference device (rf-SQUID) set corresponding to the first phase, the second tank circuit can be inductively coupled to the second modulated microwave frequency control signal by a second rf-SQUID set, corresponding to the second phase, that can be different from the first rf-SQUID set, and the third tank circuit can be inductively coupled to the third modulated microwave frequency control signal by a third rf-SQUID set, corresponding to the third phase, that can be different from the first rf-SQUID set and different from the second rf-SQUID set.

The second rf-SQUID set can include two times as many rf-SQUIDs relative to the first rf-SQUID set, and the third rf-SQUID set can include four times as many rf-SQUIDs relative to the first rf-SQUID set.

The first rf-SQUID set can include a first rf-SQUID, the second rf-SQUID set can include a second rf-SQUID and a third rf-SQUID, and the third rf-SQUID set can include a fourth rf-SQUID, a fifth rf-SQUID, a sixth rf-SQUID, and a seventh rf-SQUID.

The first modulated microwave frequency control signal, the second modulated microwave frequency control signal, and the third modulated microwave frequency control signal can be output via a computing device.

The first modulated microwave frequency control signal, the second modulated microwave frequency control signal, and the third modulated microwave frequency control signal can include a shared control signal inductively coupled to the first tank circuit via the first rf-SQUID set, the second tank circuit via the second rf-SQUID set, and the third tank circuit via the third rf-SQUID set.

The shared control signal can be output by a computing device via a clock generator and an adaptive delay module.

The adaptive delay module can be incorporated into a peripheral component interconnect express card incorporated into the computing device.

The magnet-less circulator device can include a first magnet-less circulator device corresponding to a clockwise flow of the input signal from the first circulator port to the second circulator port, and further comprising a second magnet-less circulator device comprising a fourth circulator port, a fifth circulator port, and a sixth circulator port, the forth circulator port coupled to the second circulator port of the first magnet-less circulator device, and the second magnet-less circulator device corresponding to a counterclockwise flow from the fourth circulator port to the sixth circulator port, and from the sixth circulator port to the fifth circulator port.

The input signal obtained at the first calculator port can include a qubit signal from a qubit, the sixth circulator port can obtain a circulated instance of the qubit signal from the fourth circulator port, and the sixth circulator port can be coupled to a Josephson parametric amplifier that amplifies the circulated instance of the qubit signal obtained by the fourth circulator port from the second circulator port to obtain an amplified instance of the circulated instance of the qubit signal, and can circulate, to the fifth circulator port, the amplified instance of the qubit signal.

The first magnet-less circulator device and the second magnet-less circulator device can be part of a quantum computing chip that contains the qubit.

Figure 11:
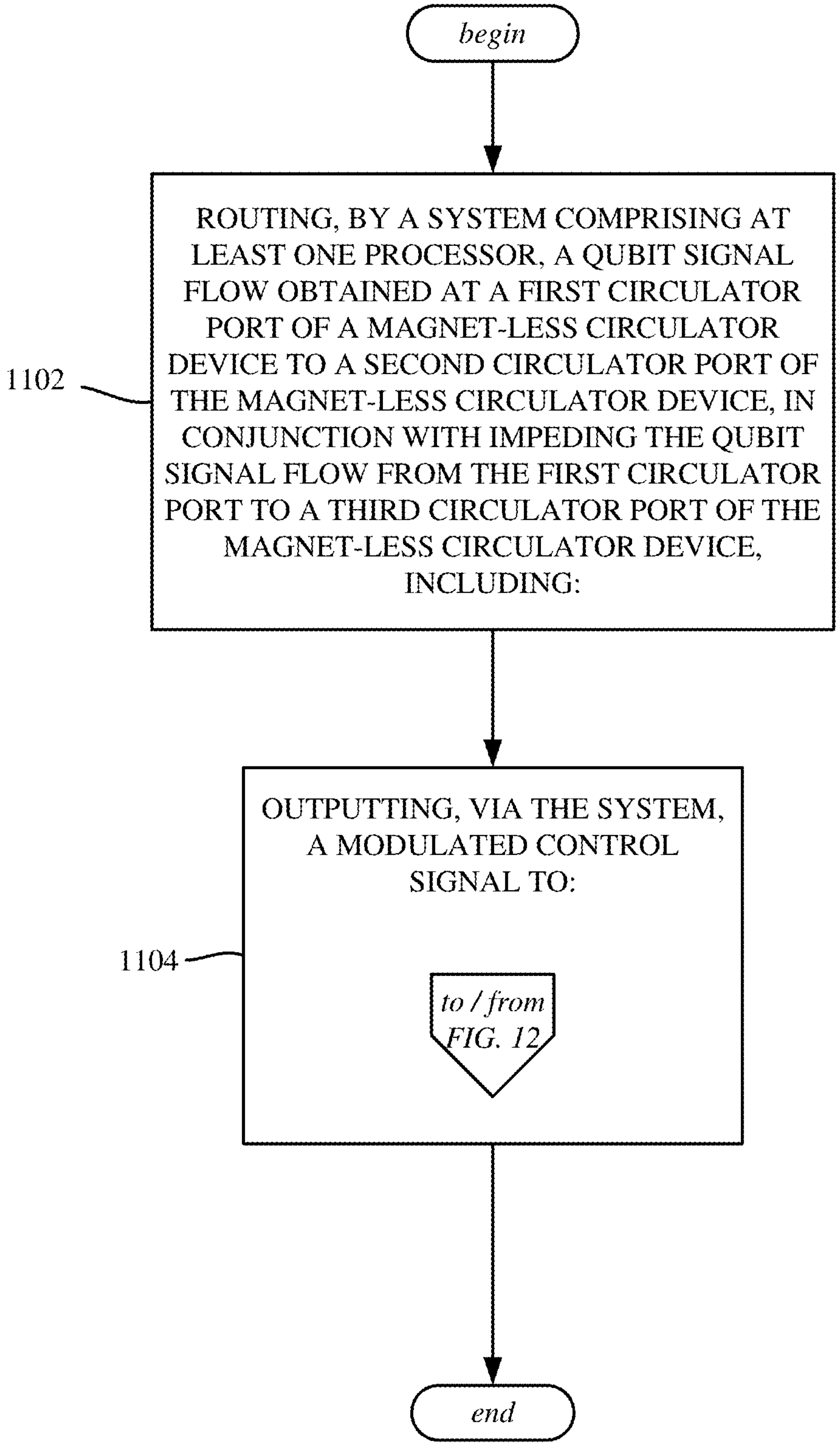
FIGS. 11 and 12 comprise a flow diagram showing example operations related to outputting a modulated control signal to route a qubit signal flow obtained at a first circulator port of a magnet-less circulator device to a second circulator port, in conjunction with impeding the qubit signal flow from the first circulator port to a third circulator port, in accordance with various example embodiments and implementations of the subject disclosure.
Figure 12:
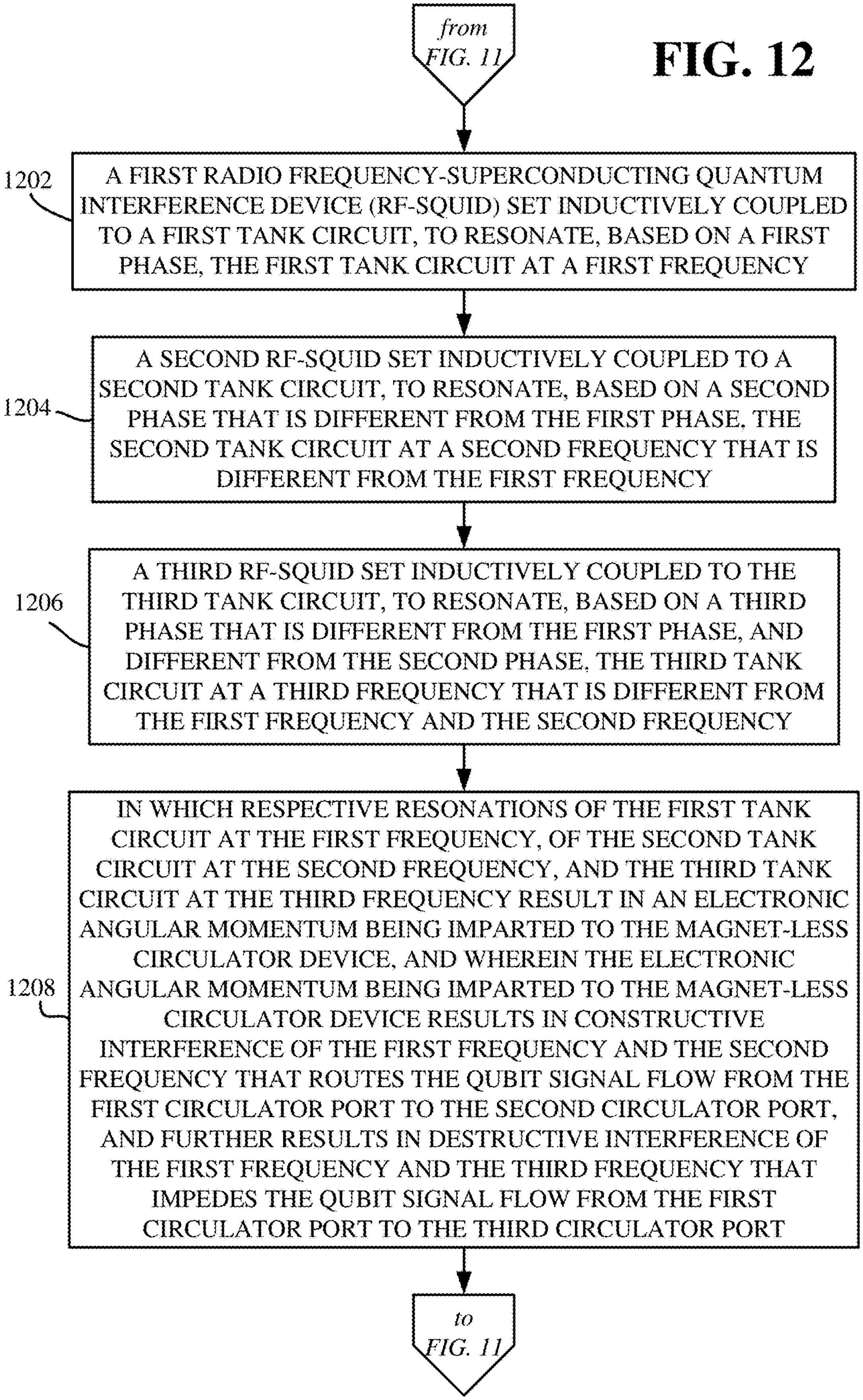

One or more example implementations and embodiments, such as corresponding to example operations of a method, can be represented in FIGS. 11 and 12. Example operation 1102 of FIG. 11 represents routing, by a system comprising at least one processor, a qubit signal flow obtained at a first circulator port of a magnet-less circulator device to a second circulator port of the magnet-less circulator device, in conjunction with impeding the qubit signal flow from the first circulator port to a third circulator port of the magnet-less circulator device, which can include example operation 1104. Example operation 1104 represents outputting, via the system, a modulated control signal to example blocks 1202, 1204, 1206 and 1208 of FIG. 12. Example block 1202 of FIG. 12 represents a first radio frequency-superconducting quantum interference device (rf-SQUID) set inductively coupled to a first tank circuit, to resonate, based on a first phase, the first tank circuit at a first frequency. Example block 1204 represents a second rf-SQUID set inductively coupled to a second tank circuit, to resonate, based on a second phase that can be different from the first phase, the second tank circuit at a second frequency that can be different from the first frequency. Example block 1206 represents a third rf-SQUID set inductively coupled to the third tank circuit, to resonate, based on a third phase that can be different from the first phase, and different from the second phase, the third tank circuit at a third frequency that can be different from the first frequency and the second frequency, in which, at example block 1208, respective resonations of the first tank circuit at the first frequency, of the second tank circuit at the second frequency, and the third tank circuit at the third frequency result in an electronic angular momentum being imparted to the magnet-less circulator device. The electronic angular momentum imparted to the magnet-less circulator device can result in constructive interference of the first frequency and the second frequency that routes the qubit signal flow from the first circulator port to the second circulator port, and further can result in destructive interference of the first frequency and the third frequency that impedes the qubit signal flow from the first circulator port to the third circulator port.

Further operations can include determining, by the system, an amplitude and a frequency of the modulated control signal that can be going to at least one of: reduce a return loss amplitude, to a defined return loss amplitude level, of the qubit signal flow to the first circulator port, reduce an insertion loss amplitude, to a defined insertion loss amplitude level, of the qubit signal flow between the first circulator port and the second circulator port, or increase an isolation amplitude, to a defined isolation amplitude level, of the qubit signal flow between the first circulator port and the third circulator port.

The magnet-less circulator device can be a first magnet-less circulator device. The electronic angular momentum can include a first electronic angular momentum imparted to the first magnet-less circulator device that corresponds to a clockwise qubit signal flow circulation direction in the first magnet-less circulator device. The second circulator port can be coupled to a fourth circulator port of a second magnet-less circulator device. Further operations can include routing, by the system, the qubit signal flow obtained at the fourth circulator port of the second magnet-less circulator device from the second circulator port of the first magnet-less circulator device, to a fifth circulator port of the second magnet-less circulator device, in conjunction with impeding the qubit signal flow from the fourth circulator port to a sixth circulator port of the second magnet-less circulator device, and outputting, via the system, the modulated control signal to: a fourth rf-SQUID set inductively coupled to a fourth tank circuit, to resonate, based on a fourth phase, the fourth tank circuit at a fourth frequency, a fifth rf-SQUID set inductively coupled to the fifth tank circuit, to resonate, based on a firth phase that can be different from the fourth phase, the fifth tank circuit at a fifth frequency that can be different from the fourth frequency, and a sixth rf-SQUID set inductively coupled to the sixth tank circuit, to resonate, based on a sixth phase that can be different from the fourth phase, and different from the fifth phase, the sixth tank circuit at a sixth frequency that can be different from the fourth frequency and the fifth frequency. Respective resonations at the fourth frequency, the fifth frequency and the sixth frequency can result in a second electronic angular momentum being imparted to the second magnet-less circulator device. The second electronic angular momentum can correspond to a counterclockwise qubit signal flow circulation direction in the second magnet-less circulator device, that can result in constructive interference of the fourth frequency and the fifth frequency that routes the qubit signal flow from the fourth circulator port to the fifth circulator port, and that can result in destructive interference of the fourth frequency and the sixth frequency that impedes the qubit signal flow from the fourth circulator port to the sixth circulator port.

One or more implementations and embodiments can be embodied in a system, such as described and represented in the example herein. The system can include a first magnet-less circulator device, which can include a first circulator port, a second circulator port, and a third circulator port. The first circulator port can be coupled to a qubit signal. The system can include a first inductor-capacitor (LC) tank circuit electrically coupled to the first circulator port, and inductively coupled to a first radio frequency-superconducting quantum interference device (rf-SQUID) set, a second LC tank circuit electrically coupled to the second circulator port, and inductively coupled to a second rf-SQUID set, and a third LC tank circuit electrically coupled to the third circulator port, and inductively coupled to a third rf-SQUID set. The system can include a second magnet-less circulator device, which can include a fourth circulator port, a fifth circulator port, and a sixth circulator port. The fourth circulator port can be coupled to the second circulator port of the first magnet-less circulator device. A fourth LC tank circuit can be electrically coupled to the fourth circulator port and can be inductively coupled to a fourth rf-SQUID set, a fifth LC tank circuit can be electrically coupled to the fifth circulator port and can be inductively coupled to a fifth rf-SQUID set, and a sixth LC tank circuit can be electrically coupled to the sixth circulator port and can be inductively coupled to a sixth rf-SQUID set. The system can include a computing device that outputs a modulated control signal to the first rf-SQUID set corresponding to a first phase shift, the second rf-SQUID set corresponding to a second phase shift, the third rf-SQUID set corresponding to a third phase shift, the fourth rf-SQUID set corresponding to a fourth phase shift, the fifth rf-SQUID set corresponding to a fifth phase shift, and the sixth rf-SQUID set corresponding to a sixth phase shift, to respectively resonate the first LC tank circuit at a first frequency, the second LC tank circuit at a second frequency that can be different from the first frequency, the third LC tank circuit at a third frequency that can be different from the first frequency and different from the second frequency, the fourth LC tank circuit at a fourth frequency, the fifth LC tank circuit at a fifth frequency that can be different from the fourth frequency, and the sixth LC tank circuit at a sixth frequency that can be different from the fourth frequency and different from the fifth frequency. The first frequency, the second frequency and the third frequency can impart a first electronic angular momentum to the first magnet-less circulator device, that can result in first constructive interference of the first frequency and the second frequency, and first destructive interference of the first frequency and the third frequency, that routes, in a clockwise direction, the qubit signal flow from the first circulator port to the second circulator port, and impedes the qubit signal flow from the first circulator port to the third circulator. The fourth frequency, the fifth frequency and the sixth frequency can impart a second electronic angular momentum to the second magnet-less circulator device, that can result in a second constructive interference of the fourth frequency and the sixth frequency that routes, in a counterclockwise direction, the qubit signal flow from the fourth circulator port, as obtained from the second circulator port to the sixth circulator port, and that can result in a second destructive interference of the fourth frequency and the fifth frequency that impedes the qubit signal flow from the fourth circulator port to the fifth circulator port.

The second phase shift can be substantially one-hundred-and-twenty degrees shifted relative to the first phase shift, the third phase shift can be substantially two-hundred-and-forty degrees shifted relative to the first phase shift, the fifth phase shift can be substantially one-hundred-and-twenty degrees shifted relative to the fourth phase shift, and the sixth phase shift can be substantially two-hundred-and-forty degrees shifted relative to the fourth phase shift.

The sixth circulator port can be coupled to a Josephson parametric amplifier that can amplify the signal routed from the fourth circulator port, and the sixth circulator port can circulate an amplified instance of the signal to the fifth circulator port.

The computing device can output the modulated control signal via a clock generator and an adaptive delay module that determine the first phase shift, the second phase shift, the third phase shift, the fourth phase shift, the fifth phase shift, and the sixth phase shift.

As can be seen, the technology described herein facilitates a magnet-less circulator that is significantly advantageous relative waveguide-based bulky magnet-based circulators. The magnet-less circulator described herein can be fabricated using standard semiconductor processes, allowing the design to be integrated more easily on the same chip as the qubits. Such integration facilitates more compact, efficient, and potentially lower-cost quantum computing systems.

The compact and magnet-free design, based on electronic modulation, eliminates the need for magnetic biasing of ferrite materials, and thus is unlike conventional ferrite circulators that require bulky magnetic bias fields. Further, the magnet-less circulator offers stable and reliable operation at cryogenic temperatures, unlike magnetic materials used in traditional circulators that can behave unpredictably at cryogenic temperatures, affecting performance. The result is robust operation, even under varying conditions, because the modulation frequency and amplitude are the deciding factors for nonreciprocal transmission. As such, under varying conditions, the modulation frequency and amplitude can be tuned from the classical computer to provide robust operation according to new conditions.

Such magnet-less circulators for quantum systems are highly practical, using spatiotemporal modulation to achieve nonreciprocity for microwave frequencies by leveraging relatively precise electronic control of phase and amplitude, (which is well within the capabilities of modern electronics). Detailed simulations have validated the technology.

The above description of illustrated embodiments of the subject disclosure, comprising what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As used in this application, the terms “component,” “system,” “platform,” “layer,” “selector,” “interface,” and the like are intended to refer to a computer-related resource or an entity related to an operational apparatus with one or more specific functionalities, wherein the entity can be either hardware, a combination of hardware and software, software, or software in execution. As an example, a component can be an apparatus with specific functionality provided by mechanical parts operated by electric or electronic circuitry. As yet another example, a component can be an apparatus that provides specific functionality through electronic components without mechanical parts, the electronic components can comprise a processor therein to execute software or firmware that confers at least in part the functionality of the electronic components.

In addition, the term “or” is intended to mean an inclusive “or” rather than an exclusive “or.” That is, unless specified otherwise, or clear from context, “X employs A or B” is intended to mean any of the natural inclusive permutations. That is, if X employs A; X employs B; or X employs both A and B, then “X employs A or B” is satisfied under any of the foregoing instances.

While the embodiments are susceptible to various modifications and alternative constructions, certain illustrated implementations thereof are shown in the drawings and have been described above in detail. It should be understood, however, that there is no intention to limit the various embodiments to the specific forms disclosed, but on the contrary, the intention is to cover all modifications, alternative constructions, and equivalents falling within the spirit and scope.

In addition to the various implementations described herein, it is to be understood that other similar implementations can be used or modifications and additions can be made to the described implementation(s) for performing the same or equivalent function of the corresponding implementation(s) without deviating therefrom. Still further, multiple processing chips or multiple devices can share the performance of one or more functions described herein, and similarly, storage can be effected across a plurality of devices. Accordingly, the various embodiments are not to be limited to any single implementation, but rather are to be construed in breadth, spirit and scope in accordance with the appended claims.

What is claimed is:

1. A system, comprising:

a magnet-less circulator device, comprising:

a first circulator port coupled to a first resonator, the first resonator inductively resonating at a first resonant frequency, based on a first modulated microwave frequency control signal having a first phase;

a second circulator port coupled to a second resonator, the second resonator inductively resonating at a second resonant frequency, based on a second modulated microwave frequency control signal having a second phase that is phase-shifted relative to the first phase; and a third circulator port coupled to a third resonator, the third resonator inductively resonating at a third resonant frequency, based on a third modulated microwave frequency control signal having a third phase that is phase-shifted relative to the first phase and phase-shifted relative to the second phase, wherein, for an input signal obtained at the first circulator port, the first resonant frequency and the second resonant frequency interfere constructively to facilitate a flow of the input signal to the second circulator port, and the first resonant frequency and the third resonant frequency interfere destructively to impede the flow of the input signal to the third circulator port, wherein the first resonator comprises a first tank circuit inductively coupled to the first modulated microwave frequency control signal, wherein the second resonator comprises a second tank circuit inductively coupled to the second modulated microwave frequency control signal, wherein the third resonator comprises a third tank circuit inductively coupled to the third modulated microwave frequency control signal, and wherein the first modulated microwave frequency control signal, the second modulated microwave frequency control signal, and the third modulated microwave frequency control signal comprise a shared control signal inductively coupled to the first tank circuit via the first rf-SQUID set, the second tank circuit via the second rf-SQUID set, and the third tank circuit via the third rf-SQUID set.

2. The system of claim 1, wherein the second phase is one-hundred-and-twenty degrees phase-shifted relative to the first phase, and wherein the second phase is two-hundred-and-forty degrees phase-shifted relative to the first phase.

3. The system of claim 1, wherein the first tank circuit is inductively coupled to the first modulated microwave frequency control signal by a first radio frequency-superconducting quantum interference device (rf-SQUID) set corresponding to the first phase, wherein the second tank circuit is inductively coupled to the second modulated microwave frequency control signal by a second rf-SQUID set, corresponding to the second phase, that is different from the first rf-SQUID set, and wherein the third tank circuit is inductively coupled to the third modulated microwave frequency control signal by a third rf-SQUID set, corresponding to the third phase, that is different from the first rf-SQUID set and different from the second rf-SQUID set.

4. The system of claim 1, wherein the second rf-SQUID set comprises two times as many rf-SQUIDs relative to the first rf-SQUID set, and wherein the third rf-SQUID set comprises four times as many rf-SQUIDs relative to the first rf-SQUID set.

5. The system of claim 1, wherein the first rf-SQUID set comprises a first rf-SQUID, wherein the second rf-SQUID set comprises a second rf-SQUID and a third rf-SQUID, and wherein the third rf-SQUID set comprises a fourth rf-SQUID, a fifth rf-SQUID, a sixth rf-SQUID, and a seventh rf-SQUID.

6. The system of claim 1, wherein the first modulated microwave frequency control signal, the second modulated microwave frequency control signal, and the third modulated microwave frequency control signal are output via a computing device.

7. The system of claim 1, wherein the shared control signal is output by a computing device via a clock generator and an adaptive delay module.

8. The system of claim 7, wherein the adaptive delay module is incorporated into a peripheral component interconnect express card incorporated into the computing device.

9. The system of claim 1, wherein the magnet-less circulator device comprises a first magnet-less circulator device corresponding to a clockwise flow of the input signal from the first circulator port to the second circulator port, and further comprising a second magnet-less circulator device comprising a fourth circulator port, a fifth circulator port, and a sixth circulator port, the forth circulator port coupled to the second circulator port of the first magnet-less circulator device, and the second magnet-less circulator device corresponding to a counterclockwise flow from the fourth circulator port to the sixth circulator port, and from the sixth circulator port to the fifth circulator port.

10. The system of claim 9, wherein the input signal obtained at the first circulator port comprises a qubit signal from a qubit, wherein the sixth circulator port obtains a circulated instance of the qubit signal from the fourth circulator port, and wherein the sixth circulator port is coupled to a Josephson parametric amplifier that amplifies the circulated instance of the qubit signal obtained by the fourth circulator port from the second circulator port to obtain an amplified instance of the circulated instance of the qubit signal, and circulates, to the fifth circulator port, the amplified instance of the qubit signal.

11. The system of claim 9, wherein the first magnet-less circulator device and the second magnet-less circulator device are part of a quantum computing chip that contains a qubit.

12. A method, comprising:

routing, by a system comprising at least one processor, a qubit signal flow obtained at a first circulator port of a magnet-less circulator device to a second circulator port of the magnet-less circulator device, in conjunction with impeding the qubit signal flow from the first circulator port to a third circulator port of the magnet-less circulator device, comprising:

outputting, via the system, a modulated control signal to:

a first radio frequency-superconducting quantum interference device (rf-SQUID) set inductively coupled to a first tank circuit, to resonate, based on a first phase, the first tank circuit at a first frequency, a second rf-SQUID set inductively coupled to a second tank circuit, to resonate, based on a second phase that is different from the first phase, the second tank circuit at a second frequency that is different from the first frequency, and a third rf-SQUID set inductively coupled to the third tank circuit, to resonate, based on a third phase that is different from the first phase, and different from the second phase, the third tank circuit at a third frequency that is different from the first frequency and the second frequency, wherein respective resonations of the first tank circuit at the first frequency, of the second tank circuit at the second frequency, and the third tank circuit at the third frequency result in an electronic angular momentum being imparted to the magnet-less circulator device, and wherein the electronic angular momentum being imparted to the magnet-less circulator device results in constructive interference of the first frequency and the second frequency that routes the qubit signal flow from the first circulator port to the second circulator port, and further results in destructive interference of the first frequency and the third frequency that impedes the qubit signal flow from the first circulator port to the third circulator port.

13. The method of claim 12, further comprising determining, by the system, an amplitude and a frequency of the modulated control signal that are going to at least one of:

reduce a return loss amplitude, to a defined return loss amplitude level, of the qubit signal flow to the first circulator port, reduce an insertion loss amplitude, to a defined insertion loss amplitude level, of the qubit signal flow between the first circulator port and the second circulator port, or increase an isolation amplitude, to a defined isolation amplitude level, of the qubit signal flow between the first circulator port and the third circulator port.

14. The method of claim 12, wherein the magnet-less circulator device is a first magnet-less circulator device, wherein the electronic angular momentum comprises a first electronic angular momentum imparted to the first magnet-less circulator device that corresponds to a clockwise qubit signal flow circulation direction in the first magnet-less circulator device, wherein the second circulator port is coupled to a fourth circulator port of a second magnet-less circulator device, and further comprising:

routing, by the system, the qubit signal flow obtained at the fourth circulator port of the second magnet-less circulator device from the second circulator port of the first magnet-less circulator device, to a fifth circulator port of the second magnet-less circulator device, in conjunction with impeding the qubit signal flow from the fourth circulator port to a sixth circulator port of the second magnet-less circulator device; and outputting, via the system, the modulated control signal to:

a fourth rf-SQUID set inductively coupled to a fourth tank circuit, to resonate, based on a fourth phase, the fourth tank circuit at a fourth frequency, a fifth rf-SQUID set inductively coupled to the fifth tank circuit, to resonate, based on a firth phase that is different from the fourth phase, the fifth tank circuit at a fifth frequency that is different from the fourth frequency, and a sixth rf-SQUID set inductively coupled to the sixth tank circuit, to resonate, based on a sixth phase that is different from the fourth phase, and different from the fifth phase, the sixth tank circuit at a sixth frequency that is different from the fourth frequency and the fifth frequency, wherein respective resonations at the fourth frequency, the fifth frequency and the sixth frequency result in a second electronic angular momentum being imparted to the second magnet-less circulator device, wherein the second electronic angular momentum corresponds to a counterclockwise qubit signal flow circulation direction in the second magnet-less circulator device, results in constructive interference of the fourth frequency and the fifth frequency that routes the qubit signal flow from the fourth circulator port to the fifth circulator port, and results in destructive interference of the fourth frequency and the sixth frequency that impedes the qubit signal flow from the fourth circulator port to the sixth circulator port.

15. The method of claim 12, wherein the second phase is one-hundred-and-twenty degrees phase-shifted relative to the first phase, and wherein the second phase is two-hundred-and-forty degrees phase-shifted relative to the first phase.

16. A system, comprising:

a first magnet-less circulator device, comprising:

a first circulator port, a second circulator port, and a third circulator port, wherein the first circulator port is coupled to a qubit signal;

a first inductor-capacitor (LC) tank circuit electrically coupled to the first circulator port, and inductively coupled to a first radio frequency-superconducting quantum interference device (rf-SQUID) set, a second LC tank circuit electrically coupled to the second circulator port, and inductively coupled to a second rf-SQUID set, and a third LC tank circuit electrically coupled to the third circulator port, and inductively coupled to a third rf-SQUID set;

a second magnet-less circulator device, comprising:

a fourth circulator port, a fifth circulator port, and a sixth circulator port, wherein the fourth circulator port is coupled to the second circulator port of the first magnet-less circulator device;

a fourth LC tank circuit electrically coupled to the fourth circulator port and inductively coupled to a fourth rf-SQUID set;

a fifth LC tank circuit electrically coupled to the fifth circulator port and inductively coupled to a fifth rf-SQUID set; and a sixth LC tank circuit electrically coupled to the sixth circulator port and inductively coupled to a sixth rf-SQUID set; and a computing device that outputs a modulated control signal to the first rf-SQUID set corresponding to a first phase shift, the second rf-SQUID set corresponding to a second phase shift, the third rf-SQUID set corresponding to a third phase shift, the fourth rf-SQUID set corresponding to a fourth phase shift, the fifth rf-SQUID set corresponding to a fifth phase shift, and the sixth rf-SQUID set corresponding to a sixth phase shift, to respectively resonate:

the first LC tank circuit at a first frequency, the second LC tank circuit at a second frequency that is different from the first frequency, the third LC tank circuit at a third frequency that is different from the first frequency and different from the second frequency;

the fourth LC tank circuit at a fourth frequency, the fifth LC tank circuit at a fifth frequency that is different from the fourth frequency, and the sixth LC tank circuit at a sixth frequency that is different from the fourth frequency and different from the fifth frequency;

wherein the first frequency, the second frequency and the third frequency impart a first electronic angular momentum to the first magnet-less circulator device, that results in first constructive interference of the first frequency and the second frequency, and first destructive interference of the first frequency and the third frequency, that routes, in a clockwise direction, the qubit signal flow from the first circulator port to the second circulator port, and impedes the qubit signal flow from the first circulator port to the third circulator; and wherein the fourth frequency, the fifth frequency and the sixth frequency impart a second electronic angular momentum to the second magnet-less circulator device, that results in a second constructive interference of the fourth frequency and the sixth frequency that routes, in a counterclockwise direction, the qubit signal flow from the fourth circulator port, as obtained from the second circulator port to the sixth circulator port, and that results in a second destructive interference of the fourth frequency and the fifth frequency that impedes the qubit signal flow from the fourth circulator port to the fifth circulator port.

17. The system of claim 16, wherein the second phase shift is substantially one-hundred-and-twenty degrees shifted relative to the first phase shift, wherein the third phase shift is substantially two-hundred-and-forty degrees shifted relative to the first phase shift, wherein the fifth phase shift is substantially one-hundred-and-twenty degrees shifted relative to the fourth phase shift, and wherein the sixth phase shift is substantially two-hundred-and-forty degrees shifted relative to the fourth phase shift.

18. The system of claim 16, wherein the sixth circulator port is coupled to a Josephson parametric amplifier that amplifies the signal routed from the fourth circulator port, and wherein the sixth circulator port circulates an amplified instance of the signal to the fifth circulator port.

19. The system of claim 16, wherein the computing device outputs the modulated control signal via a clock generator and an adaptive delay module that determine the first phase shift, the second phase shift, the third phase shift, the fourth phase shift, the fifth phase shift, and the sixth phase shift.

20. The system of claim 16, wherein the second phase shift is one-hundred-and-twenty degrees phase-shifted relative to the first phase shift, and wherein the second phase shift is two-hundred-and-forty degrees phase-shifted relative to the first phase shift.

* * * * *